United States Patent
Stewart et al.

(10) Patent No.: US 11,049,820 B2
(45) Date of Patent: Jun. 29, 2021

(54) CRACK SUPPRESSION STRUCTURE FOR HV ISOLATION COMPONENT

(71) Applicant: Texas Instruments Incorporated, Dallas, TX (US)

(72) Inventors: Elizabeth Costner Stewart, Dallas, TX (US); Jeffrey A. West, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/049,256

(22) Filed: Jul. 30, 2018

(65) Prior Publication Data
US 2020/0035617 A1    Jan. 30, 2020

(51) Int. Cl.
| H01L 23/00 | (2006.01) |
| H01L 21/02 | (2006.01) |
| H01L 21/8234 | (2006.01) |
| H01L 49/02 | (2006.01) |
| H01L 23/31 | (2006.01) |

(52) U.S. Cl.
CPC ........ *H01L 23/562* (2013.01); *H01L 21/0217* (2013.01); *H01L 21/02164* (2013.01); *H01L 21/823481* (2013.01); *H01L 23/3171* (2013.01); *H01L 28/10* (2013.01); *H01L 28/40* (2013.01)

(58) Field of Classification Search
CPC ............... H01L 23/562; H01L 23/5223; H01L 23/5227; H01L 23/5226; H01L 23/5222; H01L 28/10; H01L 21/0217; H01L 23/3171; H01L 27/0288; H01L 28/40–92
See application file for complete search history.

(56) References Cited

U.S. PATENT DOCUMENTS

| 5,618,749 | A   | 4/1997  | Takahashi et al. |
| 6,489,198 | B2* | 12/2002 | Yamasaki ............... H01L 28/55 257/E21.009 |
| 6,495,918 | B1* | 12/2002 | Brintzinger ........... H01L 23/562 257/692 |
| 6,617,666 | B2* | 9/2003  | Yoshitomi ......... H01L 21/76834 257/535 |
| 7,211,850 | B2* | 5/2007  | Miura ............... H01L 27/11502 257/295 |
| 7,348,623 | B2* | 3/2008  | Akiyama ............ H01L 23/5223 257/303 |

(Continued)

FOREIGN PATENT DOCUMENTS

WO      2016073960 A1    5/2016

OTHER PUBLICATIONS

Patent Cooperation Treaty Search Report, dated Nov. 21, 2019, PCT/US 2019/043437.

*Primary Examiner* — Khiem D Nguyen
(74) *Attorney, Agent, or Firm* — Jacqueline J. Garner; Charles A. Brill; Frank D. Cimino (57) ABSTRACT

An integrated circuit (IC) includes a substrate having functional circuitry for realizing at least one circuit function configured together with at least one high voltage isolation component including a top metal feature above the substrate. A crack suppressing dielectric structure including at least a crack resistant dielectric layer is on at least a top of the top metal feature. At least one dielectric passivation overcoat (PO) layer is on an outer portion of the top metal feature.

13 Claims, 9 Drawing Sheets

(56) References Cited

U.S. PATENT DOCUMENTS

| | | | | |
|---|---|---|---|---|
| 7,541,238 B2* | 6/2009 | Harris | | H01L 23/5227 |
| | | | | 336/200 |
| 8,138,616 B2* | 3/2012 | Chang | | H01L 23/522 |
| | | | | 257/784 |
| 8,354,735 B2* | 1/2013 | Lee | | H01L 23/562 |
| | | | | 257/401 |
| 8,361,898 B2* | 1/2013 | Wang | | H01L 24/48 |
| | | | | 438/612 |
| 8,378,495 B2 | 2/2013 | West | | |
| 8,552,486 B2* | 10/2013 | Wu | | H01L 23/5223 |
| | | | | 257/303 |
| 9,299,697 B2 | 3/2016 | West et al. | | |
| 9,806,148 B2* | 10/2017 | Selvaraj | | H01L 28/10 |
| 10,109,574 B1* | 10/2018 | West | | H01L 23/5222 |
| 10,263,066 B2* | 4/2019 | Hiroi | | H01L 23/5329 |
| 2004/0113190 A1* | 6/2004 | Oh | | H01L 28/60 |
| | | | | 257/296 |
| 2006/0012012 A1* | 1/2006 | Wang | | H01L 23/562 |
| | | | | 257/620 |
| 2006/0019435 A1* | 1/2006 | Sheppard | | H01L 29/66462 |
| | | | | 438/167 |
| 2006/0134809 A1* | 6/2006 | Brennan | | H01L 23/5223 |
| | | | | 438/3 |
| 2007/0138531 A1* | 6/2007 | Tu | | H01L 28/91 |
| | | | | 257/303 |
| 2009/0290314 A1* | 11/2009 | Bedinger | | H01L 23/4821 |
| | | | | 361/748 |
| 2010/0078687 A1* | 4/2010 | Zhang | | H01L 21/823807 |
| | | | | 257/255 |
| 2012/0112314 A1* | 5/2012 | Jou | | H01L 28/60 |
| | | | | 257/532 |
| 2013/0119514 A1* | 5/2013 | Hirota | | H01L 21/02178 |
| | | | | 257/532 |
| 2013/0341759 A1* | 12/2013 | Khan | | H01L 28/60 |
| | | | | 257/533 |
| 2013/0341793 A1* | 12/2013 | Suzumura | | H01L 23/538 |
| | | | | 257/751 |
| 2015/0187598 A1* | 7/2015 | Campbell | | H01L 21/28035 |
| | | | | 438/396 |
| 2015/0200244 A1* | 7/2015 | Barth | | H01L 23/5223 |
| | | | | 438/381 |
| 2016/0035672 A1* | 2/2016 | Funaya | | H01L 21/02164 |
| | | | | 257/531 |
| 2016/0155737 A1 | 6/2016 | Linewih et al. | | |
| 2016/0163785 A1 | 6/2016 | West et al. | | |
| 2018/0286802 A1 | 10/2018 | West et al. | | |
| 2019/0157378 A1* | 5/2019 | Luo | | H01L 27/0805 |

* cited by examiner

CRACK SUPPRESSION STRUCTURE FOR HV ISOLATION COMPONENT

FIELD

This Disclosure generally relates to the fabrication of integrated circuit (IC) devices having high voltage components such as capacitors or transformers that include crack suppression structures.

BACKGROUND

Some ICs include high voltage (HV) isolation components such as capacitors or transformers which generally include a first spiral inductor and a second spiral inductor where the first spiral inductor acts to magnetically excite the second spiral inductor. The HV isolation components are positioned above the semiconductor surface within the metal stack, generally having a top metal feature at the top metal layer directly under the passivation layer(s).

Chemical mechanical polishing/planarization (CMP) is a widely used process of smoothing surfaces with the combination of chemical and mechanical forces. The CMP process uses an abrasive and corrosive chemical slurry together with a polishing pad and retaining ring, typically of a greater diameter than the wafer. The pad and wafer are pressed together by a dynamic polishing head and held in place by a retaining ring. The dynamic polishing head is rotated with different axes of rotation which removes material from the surface of the wafer and tends to even out any irregular topography, making the wafer planar.

CMP can create cracks in dielectric layers that are polished, such as when CMP is used to planarize a passivation layer stack that generally comprises silicon oxide, such as silicon oxynitride on silicon oxide. The CMP is generally performed on the silicon oxide, then the silicon oxynitride portion of the passivation stack is deposited. The CMP process conditions may be changed to try to reduce the occurrence of such silicon oxide layer cracks.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an IC that comprises a substrate having functional circuitry for realizing at least one circuit function with at least one high voltage isolation component including a top metal feature above the substrate. A crack suppressing dielectric structure that includes at least a crack resistant dielectric layer is on at least a top of the top metal feature. At least one dielectric passivation overcoat (PO) layer is on an outer portion of the top metal feature.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

While somewhat effective, it is recognized that CMP processing solutions intended to reduce dielectric cracking do not largely eliminate the cracking due to the CMP process. This Disclosure also recognizes dielectric cracks generated during CMP can extend to and terminate on an underlying metal layer, which can result in device failure or degradation in performance. One example of device failure occurs when post-CMP dilute hydrofluoric acid (HF) cleans penetrate through a dielectric crack in the passivation layer to attack the underlying top metal, creating a void in the top metal. Such voids can lead to device failures including failures in the field as a reliability failures, or degradation in IC performance.

This Disclosure adds a dielectric crack suppression structure comprising a crack resistant dielectric layer between the passivation layer(s) and the top metal layer of the HV isolation component to be crack protected which significantly reduces the incidence of dielectric cracks reaching the top metal that can cause an IC failure or a performance degradation. The HV isolation component is generally designed to withstand a voltage across of at least 100 volts. For example, the crack resistant dielectric layer can comprise a silicon nitride (SiN) layer that can be deposited on top of the top metal before forming the passivation layer(s), which functions as a crack-stop layer to protect the top metal of the HV isolation component from chemical attack when cracks form during CMP of the passivation layer(s).

Figure 1A:
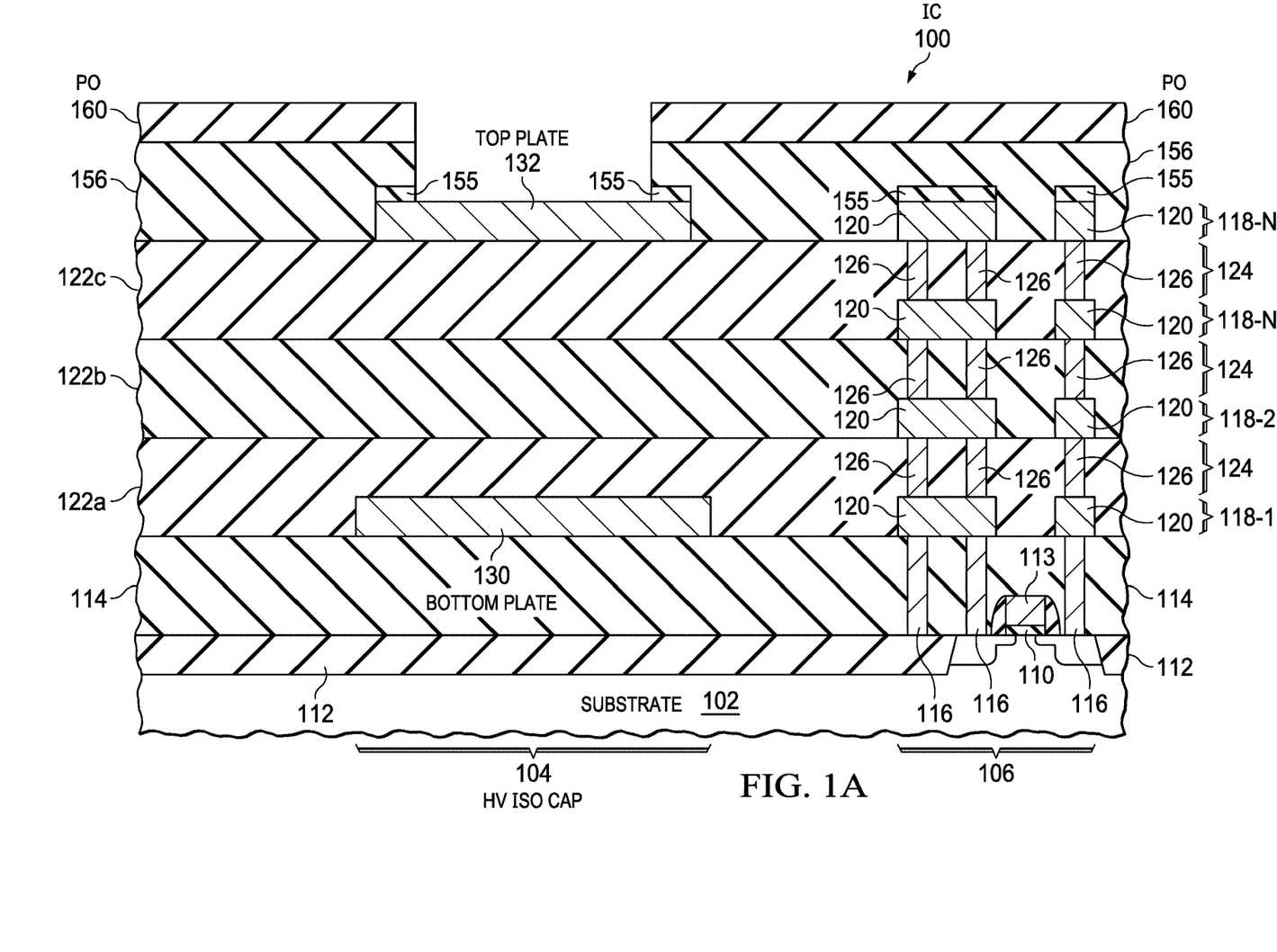
FIG. 1A depicts a cross-sectional view of a portion of an example IC having a HV isolation capacitor (HV ISO capacitor) including a disclosed dielectric crack suppression structure on top of the top plate of the HV ISO capacitor.

FIG. 1A depicts a cross-sectional view of a portion of an example IC 100 having a HV ISO capacitor 104 including a disclosed dielectric crack suppression structure 155 shown by example as a single crack resistant dielectric layer on the outer portion on top of the top plate 132 of the HV ISO capacitor 104. The dielectric crack suppression structure 155 is not shown in the inner window opened through the dielectric passivation overcoat (PO) layer 160 as it is removed during the etch of the PO layer 160.

The dielectric crack resistant dielectric layer generally comprises SiN, such as 300 to 500 A thick with 100 to 200 MPa of compressive stress. The crack resistant dielectric layer can also comprise other crack resistant materials, such as SiC. The dielectric crack suppression structure 155 can also comprise 2 or more layers, such as the 3 layer crack suppression structure shown in FIG. 1C described below with the crack resistant dielectric layer shown as 155b positioned in between a top layer 155c and a bottom layer 155a. The top plate 132 can comprise TiN, aluminum (Al), or TaN. The bottom plate of the HV ISO capacitor 104 is shown as reference 130. The bottom plate 130 can comprise for example, Al or copper, or alloys thereof.

The IC 100 may be provided as part of an IC or as a system-on-chip (SOC), and the like. Other configurations for the IC 100 such as a hybrid circuit, are within the scope of the instant example. The IC 100 is formed on a substrate 102 such as a silicon wafer. The HV ISO capacitor 104 is configured for providing galvanic isolation between two voltage domains of an IC or a system having different voltage levels. By way of illustration, a low voltage component which may operate at approximately 24 volts or less, depicted as a metal oxide semiconductor (MOS) transistor 106 with a gate dielectric layer 110 that is generally less than 70 nanometers thick has a gate electrode 113 thereon. MOS transistor 106 is part of functional circuitry that comprises circuit elements (including transistors, and generally diodes, resistors, capacitors, etc.) formed in the substrate 102 configured together with the HV ISO capacitor 104 for realizing at least one circuit function such as analog (e.g., an amplifier, power converter or power field effect transistor (FET)), RF, digital, or a memory function.

A field oxide (FOX) layer or region 112 may be formed in the substrate 102 (e.g., near or adjacent to a top surface of the substrate) to laterally electrically isolate elements of the IC 100. A pre-metal dielectric (PMD) layer 114 is formed over the substrate 102 including any FOX layer or regions prior to the deposition of subsequent metal layers (e.g., metal levels 118-1 to 118-N). Filled vias 116 may be disposed through the PMD layer 114 to provide electrical connections for the low voltage components such as MOS transistor 106, as well as other components or circuit portions (not specifically shown in FIG. 1A) of the microelectronic device 100A.

A plurality of metal levels 118-1 (bottom or "first" metal level) to 118-N (top metal level) are disposed over the PMD layer 114 that may include metal interconnects 120 connected to the MOS transistor 106, as well as any additional components, devices, or circuit portions. Inter-level dielectric (ILD) layers 122a, b, c (e.g., dielectric materials or compositions comprised of silicon dioxide-based materials and the like) are disposed between the metal interconnects 120 in each metal level. Respective via levels 124 are disposed between the metal levels 118-1 to 118-N, wherein the example via levels 124 may include metal vias 126 connecting the metal interconnects 120. In one arrangement, the various dielectric layers may be formed in a similar process flow using similar materials. It should be understood that other dielectric materials for the ILD layers 122a, 122b, 122c, such as low dielectric constant ($\kappa$) materials, are within the scope of the instant example, for instance, FSG (Fluorinated Silicate Glass with $\kappa=3.6$), OSG (Organosilicate Glass with $\kappa=2.9$) and ULK (Ultra-low k Dielectric material, with $\kappa=2.5$). The ILD layers can include capping layers and etch stop layers of different dielectric materials, such as SiN.

The bottom plate 130 of the HV ISO capacitor 104 is disposed in one of the metal levels, for example the first metal level 118-1 as depicted in FIG. 1A. The top electrode 132 of the HV ISO capacitor 104 formed from the top metal level 118-N is under a PO layer 160 such as a PO silicon oxynitride layer on another PO layer 156 such as a PO silicon oxide layer, which is depicted over ILD layer 122c.

The PO layer 156 thickness following CMP is generally 1.0 to 2.0 μm, such as being 1.5 μm measured over the top metal layer 118-N. The PO layer 160 is generally 2.5 μm to 3.0 μm, such as being about 2.8 μm and comprising silicon oxynitride. As single PO layer may also be possible, but a PO only comprising silicon oxide does not provide a moisture barrier, and a PO only comprising silicon nitride may provide too much stress when the top metal level 118-N comprises aluminum.

The bottom plate 130 and top plate 132 of the HV ISO capacitor 104 are arranged together vertically to operate as a HV capacitor for providing suitable galvanic isolation having desirable breakdown properties in an example implementation of the IC 100, for example, having typical single capacitor surge capability of up to 10 kV peak and series capacitor (reinforced isolation) surge capability of up to 17 to 24 kV peak, according to certain embodiments.

The dielectric of the HV ISO capacitor 104 comprising ILD layers 122a, 122b, and 122c may be formed to have a total thickness at least 2 microns (μm) and may be determined by a desired operating voltage of the HV ISO capacitor 104 between its plates 130, 132 and possibly also the substrate 102. For example, an embodiment of the HV ISO capacitor 104 in which the top plate 132 is designed to operate at 750 volts may have a capacitor dielectric with a thickness of 8 μm to 14 μm.

Figure 1B:
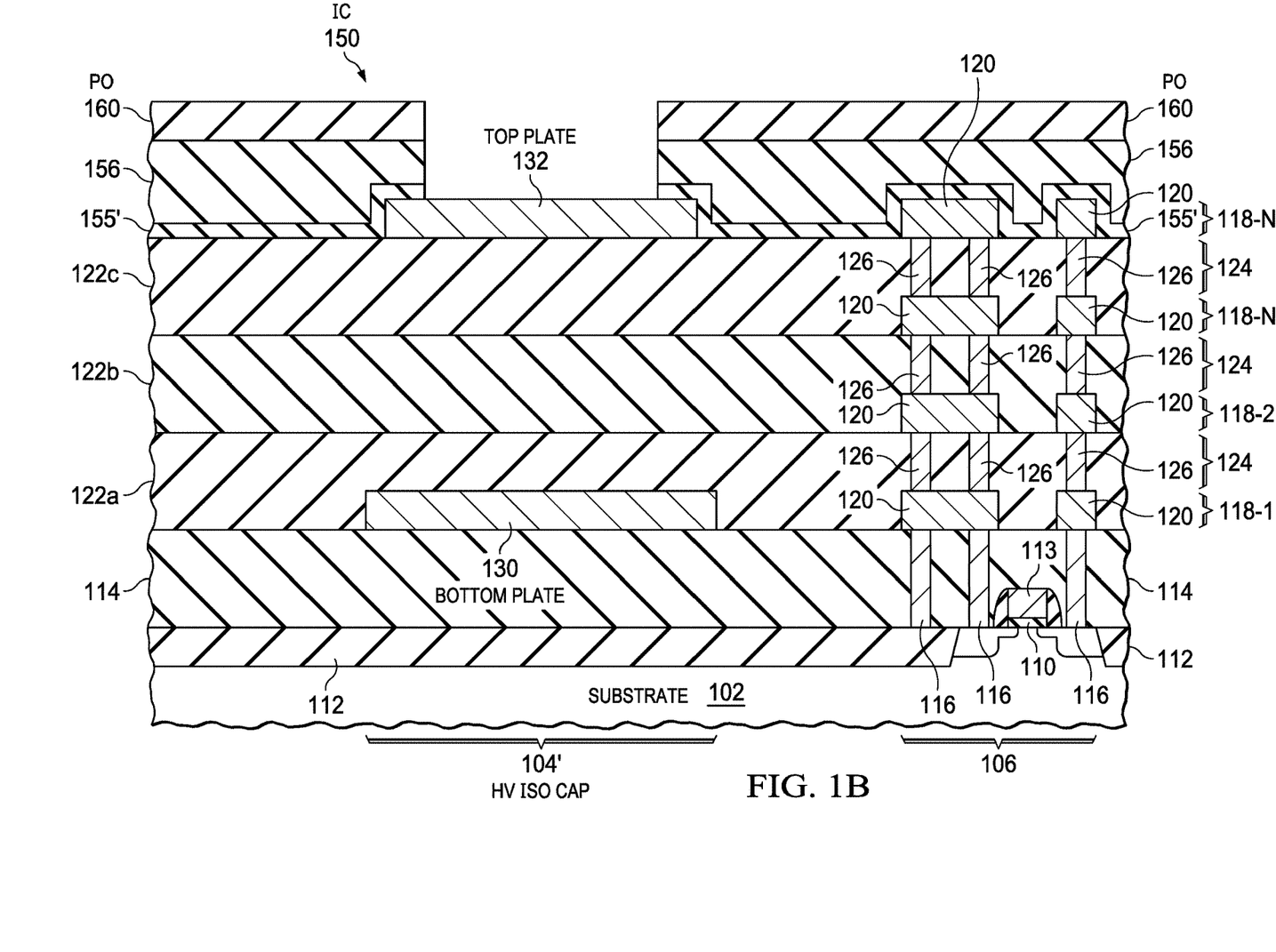
FIG. 1B depicts a cross-sectional view of a portion of an example IC having a HV ISO capacitor including a disclosed dielectric crack suppression structure on top of the top plate and along the sidewalls of the HV ISO capacitor.

FIG. 1B depicts a cross-sectional view of a portion of an example IC 150 having a HV ISO capacitor 104' including a disclosed dielectric crack suppression structure 155' on top of the top plate 132 and along the sidewalls of the HV ISO capacitor 104'. As with HV ISO capacitor 104 in FIG. 1A, the dielectric crack suppression structure 155' is not present in the inner window opened through the PO layer 160 as it is removed during the etch of the PO layer 160. The dielectric crack suppression structure can be deposited on the top metal feature (top plate 132 in FIG. 1B) prior to the patterning and the etching of the top metal feature. In this case, a single mask can be used, and the crack resistant dielectric layer (e.g., SiN) and top metal etches will generally use different chemistries, and the crack suppression structure 155' will only be on top of the top metal feature (as shown in FIG. 1A). The crack suppressing dielectric structure can also be deposited after the patterning and etching of the top metal feature. In this case, the crack suppressing dielectric structure is also positioned on top and on the sidewalls of the top metal features and over layer 122c between metal features.

Figure 1C:
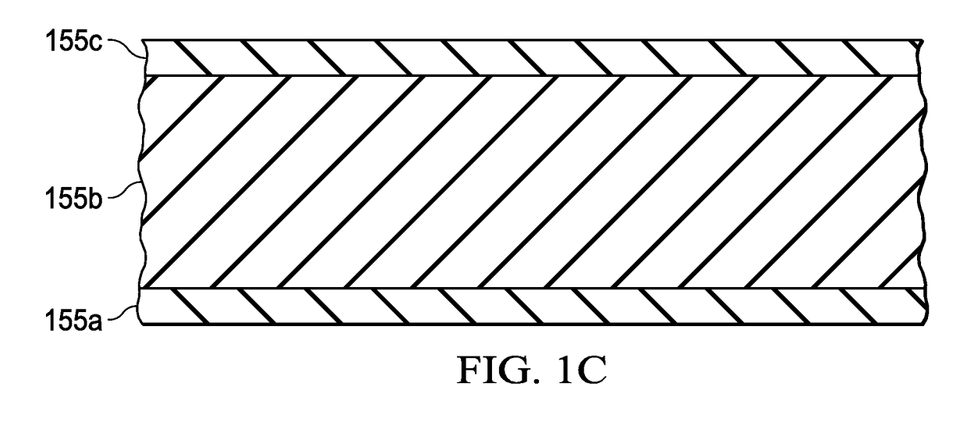
FIG. 1C shows an example 3 layer crack suppression structure.

FIG. 1C shows an example 3 layer crack suppression structure, shown as a top layer 155c on crack resistant dielectric layer 155b on a bottom layer 155a. The 3 layer crack suppression structure can include a silicon oxide layer as layer 155a for adhesion, a SiN as crack resistant dielectric layer 155b for the crack suppression dielectric layer, and layer 155c comprising a capping oxide to provide a hydrophilic surface for metal patterning. One particular example 3 layer dielectric crack suppression structure stack comprises layer 155a as a 50 A silicon oxide layer, crack resistant dielectric layer 155*b* as a 300 to 500 A SiN layer, and layer 155*c* as a 50 A silicon oxide layer.

Figure 2A:
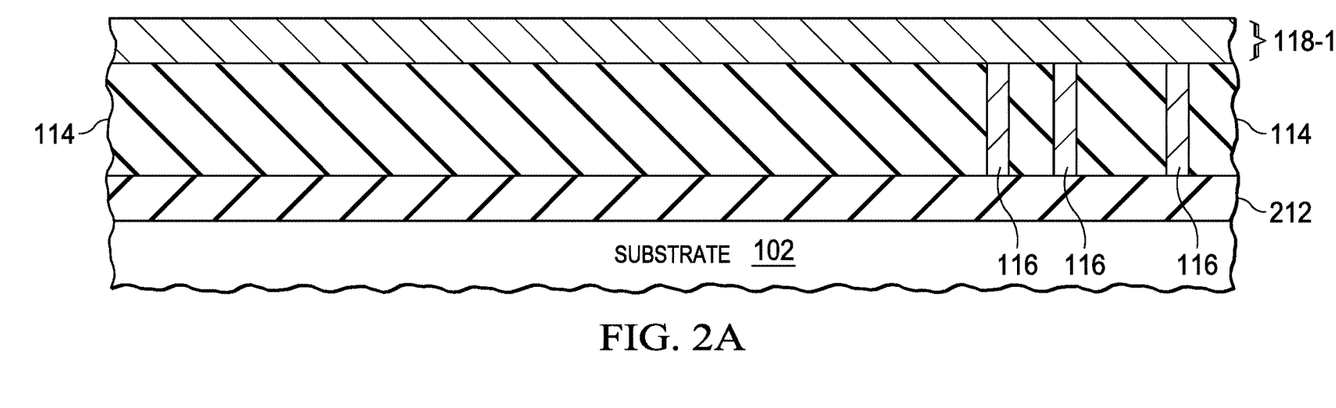
FIGS. 2A-2F are cross-sectional diagrams showing processing progression for an example method of forming an IC having a HV ISO capacitor, according to an example aspect.

FIG. 2A illustrates in a cross-section view the structure of an in-process HV ISO capacitor on an IC shown at the beginning of the formation of the bottom plate 130. Depicted in FIG. 2A is a semiconductor substrate 102, and the processing layers 212 thereon that represent multiple layers formed during front end processing in prior performed conventional semiconductor processing steps, PMD layer 114 on the processing layer and metal level 118-1 on the PMD layer 114. Filled vias 116 are formed through the PMD layer 114. Metal level 118-1 will be patterned become a bottom plate 130 in the final HV ISO capacitor. In the processing layers 212, the prior processing steps such as lithography, etch, ion implantation and diffusion to form various devices (not shown for simplicity) in the substrate 102 and may interconnect them, such as transistors including MOS transistors, bipolar transistors, or FETs other than MOS, diodes, resistors, inductors, capacitors and the like.

Metal level 118-1 can be, for example, Al or copper or alloys thereof, the metal being the one used in the particular semiconductor fabrication process. Single and dual damascene copper or copper alloy materials can be used to form metal level 118-1. However, FIGS. 2B-2G show use of non-damascene metal layer processing made possible by aluminum metal layers which unlike copper can be directly etched.

Figure 2B:
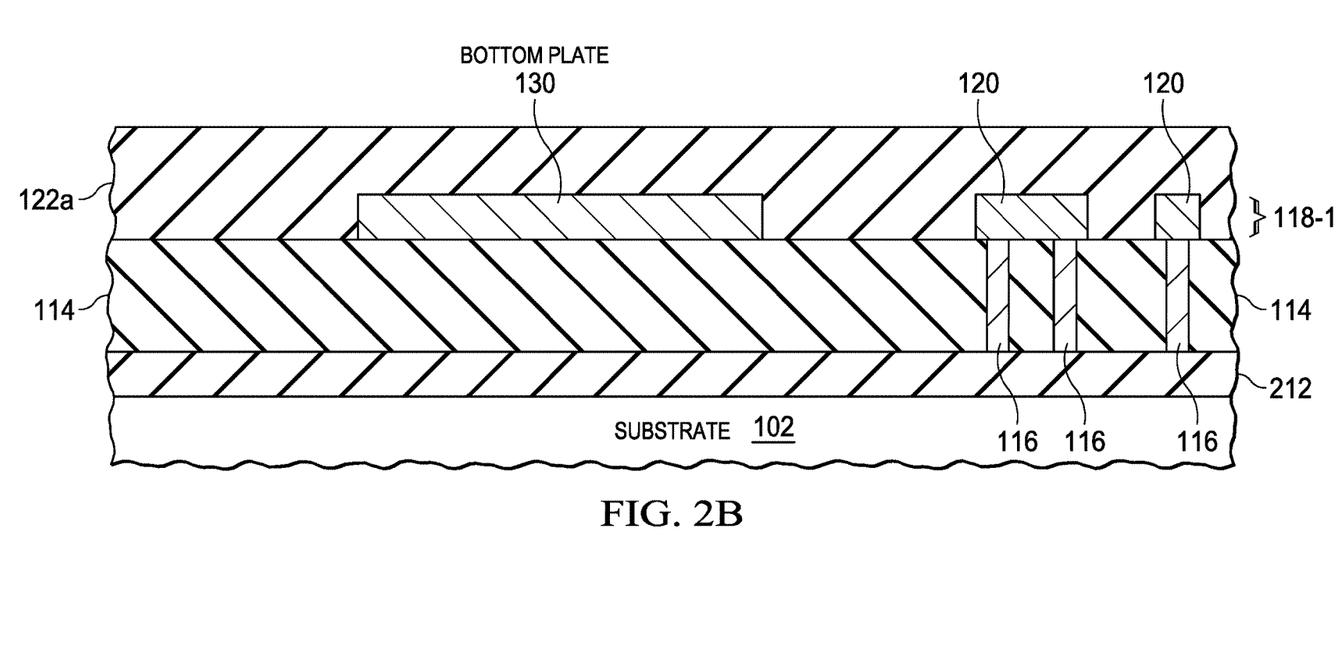
Figure 2C:
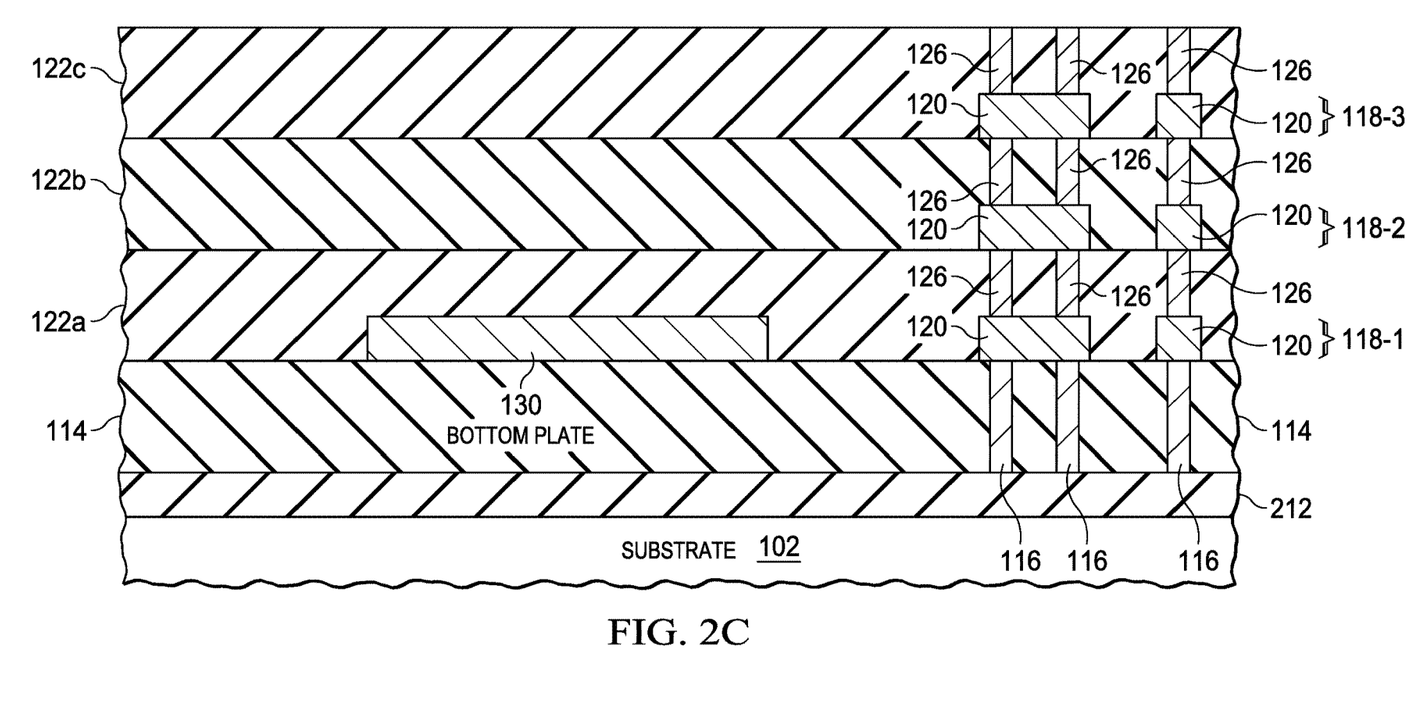

FIG. 2B shows the in-process HV ISO capacitor on an IC after patterning of metal level 118-1 including to form the bottom plate 130 of the HV ISO capacitor, followed by the deposition and subsequent planarization of ILD layer 122*a*. FIG. 2C shows the in-process HV ISO capacitor on an IC after forming several more metal interconnect levels shown as 118-2, 118-3 separated by ILDs 122*a*, 122*b*, 122*c* comprising forming filled vias 116 in the ILD layers, followed by forming patterned metal thereon, etc. In the region over the bottom plate 130 to form the HV ISO capacitor there is only dielectric, shown as ILD layers 122*a*, 122*b*, and 122*c*. The metal level providing the bottom plate 130 is shown as 118-1.

Figure 2D:
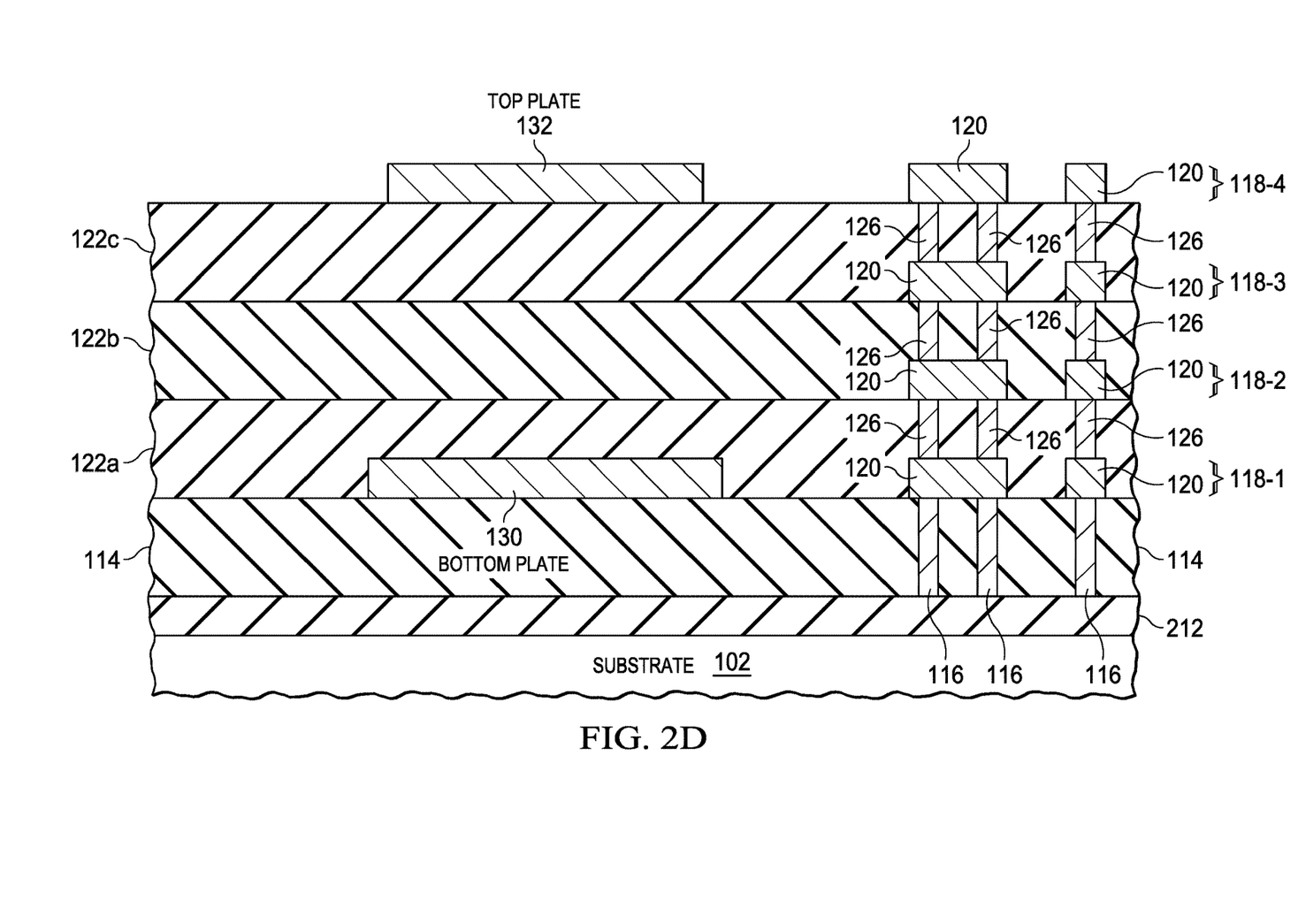
Figure 2E:
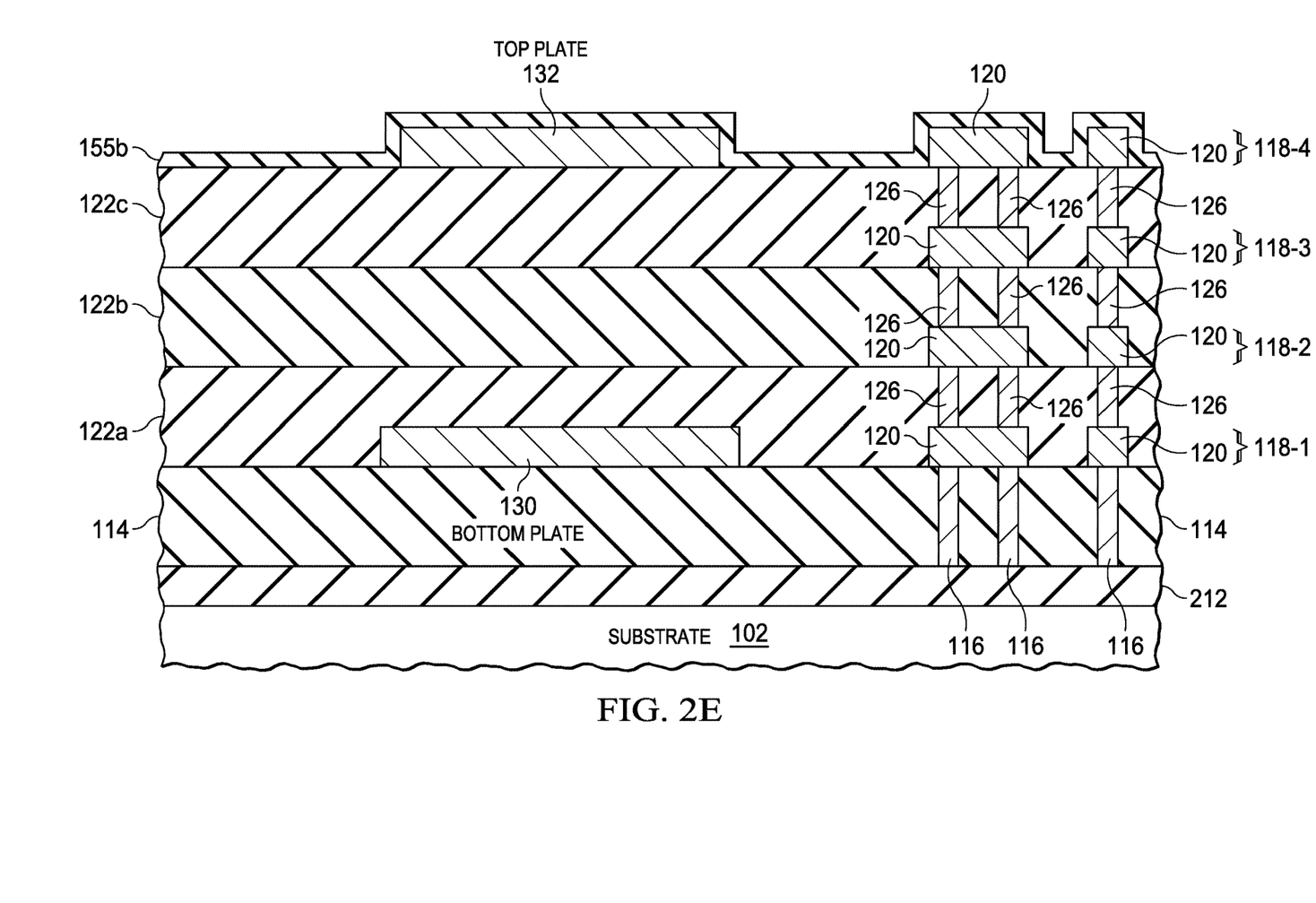
Figure 2F:
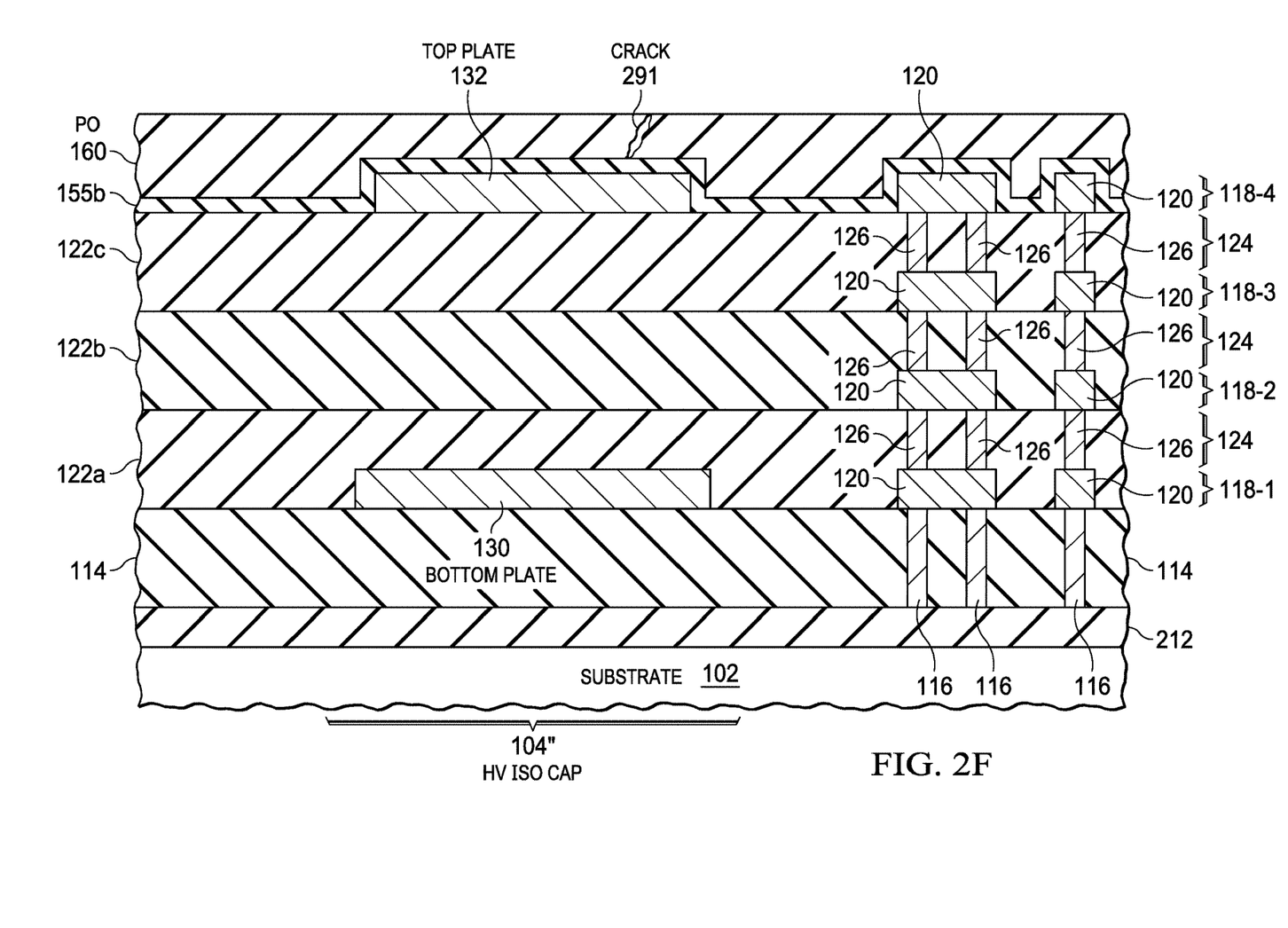

FIG. 2D shows the in-process HV ISO capacitor on the IC after forming and patterning the top metal level 118-4 including a top plate 132. FIG. 2E shows the in-process HV ISO capacitor on the IC after forming a dielectric crack suppression structure shown as crack resistant dielectric layer 155*b* on top of the top plate 132 and along the sidewalls of the HV ISO capacitor. The dielectric layer(s) for the dielectric crack suppression structure can be deposited by a low-pressure chemical vapor deposition (LPCVD) process, such as plasma enhanced CVD (PECVD), or high-pressure deposition (HPD). FIG. 2F shows the HV ISO capacitor as 104" on the IC after forming a PO layer 160 included over the crack resistant dielectric layer 155*b* followed by planarization with chemical mechanical planarization (CMP).

A crack 291 is shown emanating from the surface of the PO layer 160 (that can be due to CMP processing) stopping at the crack resistant dielectric layer 155*b*. As described above, the crack resistant dielectric layer 155*b* or the respective layers of a dielectric crack suppression structure when comprising two or more layers is generally removed in the inner window opened through the PO layer 160 during the etch of the PO layer 160. Not shown is etching an aperture through the PO layer 160 over a portion of the top plate 132 to enabling bonding a bond wire thereto. Although no contact is shown to the bottom plate 130, contact is generally made by an extension of metal interconnects 120 from the bottom plate over to a nearby circuit element such as a digital converter or modulator. The connection to bottom plate 130 can be either an input or an output node, depending on if the HV ISO capacitor is in a transmitter channel or a receiver channel.

Figure 2G:
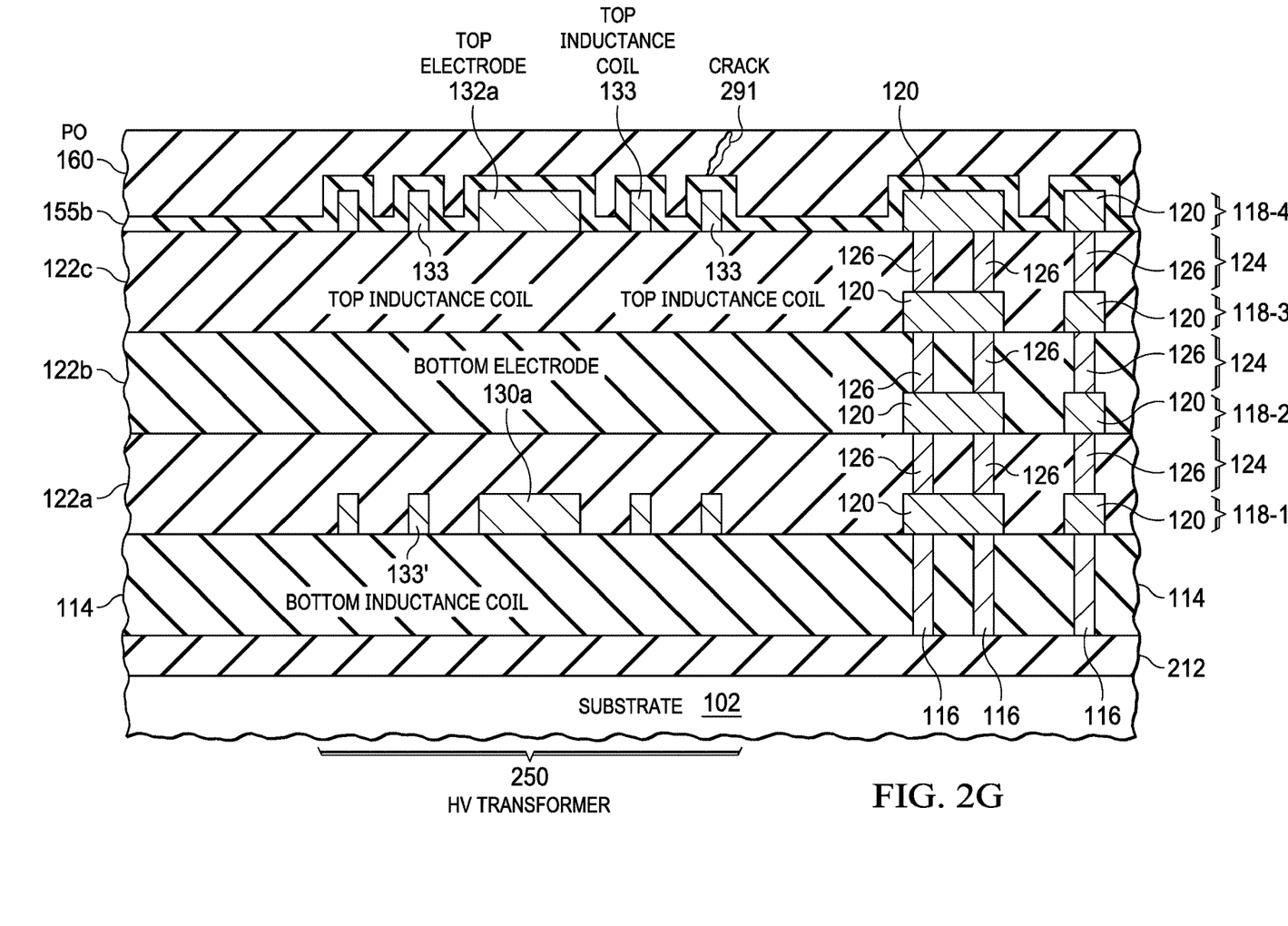
FIG. 2G is a cross-sectional diagram showing a step in the process progression corresponding to FIG. 2F for the HV ISO capacitor for an example method of forming an IC having a HV transformer, according to an example aspect.

FIG. 2G is a cross-sectional diagram showing a step in the process progression corresponding to FIG. 2F for the HV ISO capacitor for an example method of forming an IC having a HV transformer 250, according to an example aspect. The HV transformer 250 includes a top electrode 132*a*, a top inductance coil 133, and a bottom electrode 130*a* and bottom inductance coil 133'. In the case of magnetic sensors, only one inductance coil is needed on the top.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
   providing a substrate having functional circuitry for realizing at least one circuit function with at least one high voltage isolation component including a top metal feature above the substrate;
   providing a first metal interconnect level, at least one second metal interconnect level over the first metal interconnect level, and a third metal interconnect level over the at least one second metal interconnect level, the third metal interconnect level including the top metal feature;
   depositing a crack suppressing dielectric structure comprising at least one crack resistant dielectric layer on the top metal feature wherein the crack resistant dielectric layer is not directly coupled to the top metal feature;
   patterning and etching at least the top metal feature;
   depositing at least one dielectric passivation overcoat (PO) layer on at least a top of the top metal feature, and planarizing the dielectric PO layer.

2. The method of claim 1, wherein the crack suppressing dielectric structure is deposited on the top metal feature prior to the patterning and the etching of the top metal feature.

3. The method of claim 1, wherein the crack suppressing dielectric structure is deposited after the patterning and the etching of the top metal feature so that so that the crack suppressing dielectric structure is also positioned on sidewalls of the top metal feature.

4. The method of claim 1, wherein the crack resistant dielectric layer comprises a silicon nitride (SiN) layer or a silicon carbide (SiC) layer.

5. The method of claim 4, wherein the SiN layer or the SiC layer is 200 to 800 A thick and has a 50 to 500 megapascal (Mpa) compressive stress.

6. The method of claim 1, wherein the crack resistant dielectric layer comprises a silicon nitride (SiN) layer that is deposited by a plasma enhanced chemical vapor deposition process.

7. The method of claim 6, wherein the depositing the crack suppressing dielectric structure further comprises depositing a bottom silicon oxide layer before the depositing of the SiN layer and depositing a top silicon oxide layer after the depositing of the SiN layer.

8. The method of claim 1, wherein the planarizing the dielectric PO layer comprises chemical mechanical polishing (CMP).

9. The method of claim 1, wherein the high voltage isolation component comprises a high voltage capacitor.

10. The method of claim 1, wherein the high voltage isolation component comprises a transformer, and wherein the top metal feature comprises a top electrode inductively coupled to an outer positioned inductance coil.

11. The method of claim 1, further comprising etching an opening through the dielectric PO layer and through the crack suppressing dielectric structure to reach the top metal feature.

12. The method of claim 1, wherein the PO layer is touching the top metal feature.

13. A method of fabricating an integrated circuit (IC), comprising:
    forming a lower metal interconnect level over a substrate, the lower metal interconnect level including a bottom capacitor plate of a capacitor;
    forming two or more intermediate metal interconnect levels over the lower metal interconnect level;
    forming a metal interconnect layer of a top metal interconnect level over the two or more intermediate metal interconnect levels;
    depositing a crack suppressing dielectric structure on the metal interconnect layer, the crack suppressing dielectric structure comprising at least one crack resistant dielectric layer of silicon nitride (SiN) or silicon carbide (SiC);
    patterning and etching the metal interconnect layer to form a top capacitor plate of the capacitor;
    depositing at least one dielectric passivation overcoat (PO) layer on the crack suppressing dielectric structure such that the crack suppressing dielectric structure touches both the PO layer and the top capacitor plate; and
    planarizing the dielectric PO layer.

* * * * *